(12) United States Patent
Chen et al.

(10) Patent No.: US 11,450,783 B2
(45) Date of Patent: Sep. 20, 2022

(54) SELECTIVE EMITTER SOLAR CELL AND METHOD FOR PREPARING SAME

(71) Applicants: ZHEJIANG JINKO SOLAR CO., LTD., Zhejiang (CN); JINKO SOLAR CO., LTD., Jiangxi (CN)

(72) Inventors: Shi Chen, Zhejiang (CN); Jie Yang, Zhejiang (CN); Zhao Wang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/322,895

(22) Filed: May 17, 2021

(65) Prior Publication Data

US 2022/0165906 A1 May 26, 2022

(30) Foreign Application Priority Data

Nov. 23, 2020 (CN) .......................... 202011323754.2

(51) Int. Cl.
- *H01L 31/18* (2006.01)
- *H01L 31/0236* (2006.01)
- *H01L 31/0224* (2006.01)

(52) U.S. Cl.
CPC ........ *H01L 31/186* (2013.01); *H01L 31/0236* (2013.01); *H01L 31/02363* (2013.01); *H01L 31/022433* (2013.01)

(58) Field of Classification Search
CPC ......... H01L 31/022433; H01L 31/0236; H01L 31/02363; H01L 31/18–1896
See application file for complete search history.

(56) References Cited

U.S. PATENT DOCUMENTS

| 3,150,999 A | * | 9/1964 | Rudenberg ........ H01L 31/02363 257/466 |
| 4,110,122 A | * | 8/1978 | Kaplow ................ H01L 31/047 136/246 |

(Continued)

FOREIGN PATENT DOCUMENTS

| CN | 102315317 A | 1/2012 |
| CN | 103560170 A | 2/2014 |

(Continued)

OTHER PUBLICATIONS

Zhejiang Jinko Solar Co., Ltd., et al., Extended European Search Report, EP 21173962.8, dated Jan. 12, 2022, 6 pgs.

(Continued)

*Primary Examiner* — Golam Mowla
(74) *Attorney, Agent, or Firm* — USCH Law, PC

(57) ABSTRACT

A method for preparing a selective emitter solar cell includes: forming a textured surface with a plurality of protrusions in the first regions and the second regions of the surface of the semiconductor substrate, wherein each protrusion has a cross-sectional shape that is trapezoidal or trapezoid-like in a thickness direction of the semiconductor substrate; performing a diffusion treatment on at least part of protrusions to form a first doped layer, and forming a first oxide layer above the first regions; re-etching the surface of the semiconductor substrate by using the first oxide layer as a mask, to etch each protrusion in the second regions to form a pyramid structure, such that the first doped layer in the second regions is etched to form a second doped layer with a doping concentration lower than a doping concentration of the first doped layer.

20 Claims, 7 Drawing Sheets

(56) References Cited

U.S. PATENT DOCUMENTS

| | | | | |
|---|---|---|---|---|
| 4,135,950 A | * | 1/1979 | Rittner | H01L 31/022425 257/E31.13 |
| 4,227,942 A | * | 10/1980 | Hall | H01L 31/035281 257/E31.13 |
| 6,127,623 A | * | 10/2000 | Nakamura | H01L 31/068 257/E31.13 |
| 6,147,297 A | * | 11/2000 | Wettling | H01L 31/02363 257/E31.13 |
| 6,541,696 B2 | * | 4/2003 | Washio | H01L 27/1421 257/E31.13 |
| 2005/0039788 A1 | * | 2/2005 | Blieske | F24S 23/10 136/246 |
| 2007/0204902 A1 | * | 9/2007 | Dutta | H01L 51/447 257/E31.13 |
| 2012/0090673 A1 | * | 4/2012 | Dimitrov | H01L 31/02168 257/E31.13 |
| 2013/0042913 A1 | | 2/2013 | Crafts et al. | |
| 2013/0167915 A1 | | 7/2013 | Moslehi et al. | |

FOREIGN PATENT DOCUMENTS

| | | | | |
|---|---|---|---|---|
| CN | 104409571 A | | 3/2015 | |
| CN | 104576783 A | | 4/2015 | |
| CN | 104659159 A | | 5/2015 | |
| CN | 104934500 A | | 9/2015 | |
| CN | 109449251 A | | 3/2019 | |
| CN | 109802009 A | | 5/2019 | |
| DE | 4426347 A1 | * | 2/1995 | B01D 29/012 |
| JP | H11274538 A | | 10/1999 | |
| JP | 2000022185 A | | 1/2000 | |
| JP | 2004281569 A | | 10/2004 | |
| JP | 5019397 B2 | | 9/2012 | |
| JP | 201358632 A | | 3/2013 | |
| JP | 2015122435 A | | 7/2015 | |
| WO | WO-2014011260 A2 | * | 1/2014 | H01L 31/022441 |

OTHER PUBLICATIONS

Zhejiang Jinko Solar Co., Ltd., et al., CN First Office Action with English Translation, CN 202011323754.2, dated Dec. 3, 2021, 21 pgs.

Zhejiang Jinko Solar Co., Ltd., et al., JP First Office Action, JP2021-082798, dated Aug. 26, 2021, 3 pgs.

* cited by examiner

SELECTIVE EMITTER SOLAR CELL AND METHOD FOR PREPARING SAME

CROSS-REFERENCE TO RELATED APPLICATION

The present application claims the benefit of priority to Chinese Patent Application No. 202011323754.2 filed on Nov. 23, 2020, which is incorporated herein by reference in its entirety.

TECHNICAL FIELD

Embodiments of the present disclosure relate to the solar cell, in particular to a selective emitter solar cell and a method for preparing the selective emitter solar cell.

BACKGROUND

With the development of photovoltaic (PV) industry, the demand of PV module for a high-efficiency solar cell is increasing, especially for a solar cell with a high open circuit voltage. In the industrial production of the high-efficiency solar cell, a selective emitter solar cell is widely used. A structure of the selective emitter solar cell is characterized by forming a highly-doped deeply-expanded region in a region contacting a metal grid line and forming a lowly-doped shallowly-expanded region in a region not contacting a metal grid line. By performing selective doping process on the emitter region, different diffusion effects can be achieved in the region contacting a metal grid line and in the region not contacting a metal grid line, thereby reducing a series resistance and improving the efficiency of the solar cell.

At present, in the manufacturing process of the selective emitter solar cell, before diffusing the region contacting a metal grid line and the region not contacting a metal grid line of a semiconductor substrate to form a doped layer with different diffusion effects, the region contacting a metal grid line and the region not contacting a metal grid line are etched to form a textured surface with a plurality of pyramid structures as a light trapping structure, so as to enhance the light trapping effect. In this case, when the region contacting a metal grid line and the region not contacting a metal grid line are diffused to form the doped layer with different diffusion effects, a doping concentration of a doping element in the region contacting a metal grid line is relatively high and the doping element is easy to accumulate at a defect of the pyramid structure (i.e., a tip of the pyramid structure), so that the selective emitter solar cell has a relatively large recombination loss during application.

Therefore, it is desired to provide a selective emitter solar cell and a method for preparing the selective emitter solar cell, to reduce a recombination loss of the selective emitter solar cell during application.

SUMMARY

Some embodiments of the present disclosure are intended to provide a selective emitter solar cell and a method for preparing the selective emitter solar cell, to reduce a recombination loss of the selective emitter solar cell during application.

Some embodiment of the present disclosure provides a method for preparing a selective emitter solar cell, including: etching first regions and second regions of a surface of a semiconductor substrate, to form a textured surface with a plurality of protrusions in the first regions and the second regions of the surface of the semiconductor substrate, wherein each of the plurality of protrusions has a cross-sectional shape that is trapezoidal or trapezoid-like in a thickness direction of the semiconductor substrate; performing a diffusion treatment on at least part of the plurality of protrusions to form a first doped layer, and forming a first oxide layer above the first regions, wherein the first doped layer includes a P-type doping element or an N-type doping element; re-etching the surface of the semiconductor substrate by using the first oxide layer as a mask, to etch each of the plurality of protrusions in the second regions to form a pyramid structure, such that the first doped layer in the second regions is etched to form a second doped layer with a doping concentration lower than a doping concentration of the first doped layer; and removing the first oxide layer to retain the first doped layer in the first regions, and providing the selective emitter including the first doped layer in the first regions and the second doped layer in the second regions.

Some embodiments of the present disclosure further provides a selective emitter solar cell, including: a semiconductor substrate, and a selective emitter provided in the semiconductor substrate; wherein a surface of the semiconductor substrate includes first regions and second regions, the first regions include a plurality of protrusions, a cross-sectional shape of each of the plurality of protrusions in a thickness direction of the semiconductor substrate is trapezoidal or trapezoid-like, and at least part of the plurality of the protrusions forms a first doped layer doped with a P-type doping element or an N-type doping element; the second regions include a plurality of pyramid structures, and at least part of the plurality of pyramid structures forms a second doped layer doped with the P-type doping element or the N-type doping element; wherein a doping concentration of the first doped layer is greater than a doping concentration of the second doped layer, and the first doped layer and the second doped layer form the selective emitter.

In some embodiments, the performing the diffusion treatment on at least part of the plurality of protrusions to form the first doped layer, and forming the first oxide layer above the first regions includes: performing the diffusion treatment on the at least part of the plurality of protrusions to form the first doped layer, and forming a second oxide layer above the textured surface; forming a shielding layer above the first regions on the second oxide layer; etching the second oxide layer by using the shielding layer as a second mask until the semiconductor substrate is exposed, such that the second oxide layer is etched in order to form the first oxide layer above the first regions; and removing the shielding layer.

In some embodiments, the second oxide layer has a thickness of 50 nm to 150 nm in a thickness direction of the semiconductor substrate. By this way, the time for etching the second oxide layer can be reduced, thereby reducing the preparing time of the selective emitter solar cell.

In some embodiments, the etching the first regions and the second regions of the surface of the semiconductor substrate includes: placing the semiconductor substrate in a first texturing solution at a temperature of 65° C. to 85° C., and etching the first regions and the second regions of the surface of the semiconductor substrate, wherein the first texturing solution includes a texturing additive, a hydrogen peroxide and a potassium hydroxide.

In some embodiments, a volume ratio of the texturing additive, the hydrogen peroxide and the potassium hydroxide in the first texturing solution is 2:8:3.

In some embodiments, the re-etching the surface of the semiconductor substrate using the first oxide layer as the mask includes: placing the semiconductor substrate in a second texturing solution at a temperature of 75° C. to 85° C., and re-etching the surface of the semiconductor substrate by using the first oxide layer as the mask, wherein the second texturing solution includes a texturing additive and a potassium hydroxide. By this way, an etching rate of the second regions of the surface of the semiconductor substrate is increased and the preparing time of the selective emitter solar cell is further reduced.

In some embodiments, a volume ratio of the texturing additive and the potassium hydroxide in the second texturing solution is 1:3.

In some embodiments, each of the first regions refers to a highly-doped deeply-expanded region contacting a metal grid line of the selective emitter solar cell; each of the second regions refers to a lowly-doped shallowly-expanded region not contacting a metal grid line of the selective emitter solar cell.

In some embodiments, the performing a diffusion treatment on at least part of the plurality of protrusions to form a first doped layer includes: doping the at least part of the plurality of protrusions with doping element by using a high-temperature diffusion process or an ion implantation process to form the first doped layer.

In some embodiments, after the removing the shielding layer, the method sequentially includes: growing a passivation oxide layer in the first regions and the second regions of the semiconductor substrate, forming an anti-reflection film on the passivation oxide layer, screen printing grid lines in the first regions, and sintering the grid lines.

In some embodiments, the screen printing grid lines in the first regions includes: performing screen printing in the first regions to leave metal paste on the surfaces of the plurality of protrusions of the first regions.

In some embodiments, the performing the diffusion treatment on the at least part of the plurality of protrusions to form the first doped layer, and forming a second oxide layer above the textured surface includes: covering with boron element on the surface of the semiconductor substrate by using a thin layer chromatography process, to generate a borosilicate glass in the thickness direction of the semiconductor substrate; using the borosilicate glass as the second oxide layer above the textured surface.

In some embodiments, the forming a second oxide layer above the textured surface includes: forming the second oxide layer above the textured surface by using a chemical vapor deposition process after the performing the diffusion treatment on the at least part of the plurality of protrusions to form the first doped layer.

In some embodiments, the forming a shielding layer above the first regions on the second oxide layer including: the shielding layer above the first regions on the second oxide layer is formed by plating or 3D printing, wherein the shielding layer is a paraffin wax; the etching the second oxide layer by using the shielding layer as a second mask until the semiconductor substrate is exposed includes: the semiconductor substrate with the shielding layer is subjected to the acidic solution to remove the second oxide layer above the second regions.

In some embodiments, a sheet resistance of the first doped layer is 60 Ω/sq to 120 Ω/sq.

In some embodiments, a sheet resistance of the second doped layer is greater than 150 Ω/sq.

In some embodiments, a doping depth of the doping element of the first doped layer is 0.8 um to 1.5 um, and a doping concentration of the doping element of the first doped layer is $3\times10^{20}$ to $5\times10^{20}$ doping elements per square centimeter.

In some embodiments, a doping depth of the doping element of the second doped layer is less than 0.7 um, and a doping concentration of the doping element of the second doped layer is $5\times10^{18}$ to $2\times10^{19}$ doping elements per square centimeter.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

Embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented based on various changes and modifications of the following embodiments.

Some embodiments of the present disclosure relate to a method for preparing a selective emitter solar cell. In the method, a textured surface with a plurality of protrusions is formed on first regions and second regions of a surface of a semiconductor substrate. A cross-sectional shape of each of the plurality of protrusions in a thickness direction of the semiconductor substrate is substantially trapezoidal or trapezoid-like. A diffusion treatment is performed on at least part of the plurality of protrusions to form a first doped layer. The first doped layer refers to a layer of the doped region of the protrusions. A first oxide layer is formed only above the first regions. The surface of the semiconductor substrate is re-etched by using the first oxide layer as a mask to etch each protrusion in the second regions to form a pyramid structure, and the first doped layer in the second regions is etched to form a second doped layer with a doping concentration lower than a doping concentration of the first doped layer. The second doped layer refers to a layer of the doped region of the protrusions in the second regions after the re-etching process. The first regions include a plurality of protrusions, at least part of the protrusions in the first regions is the first doped layer doped with a P-type doping element or an N-type doping element, and the cross-section shape of each protrusion in the thickness direction of the semiconductor substrate is substantially trapezoidal or trapezoid-like, so that the protrusion has no defect (tip), thereby avoiding the accumulation of the doping elements in the protrusion and reducing a recombination loss of the selective emitter solar cell during application.

The details of this embodiment will be described in detail below. The following contents are only implementation details provided for convenience of understanding, and may be not essential for implementing the present solution.

Figure 1:
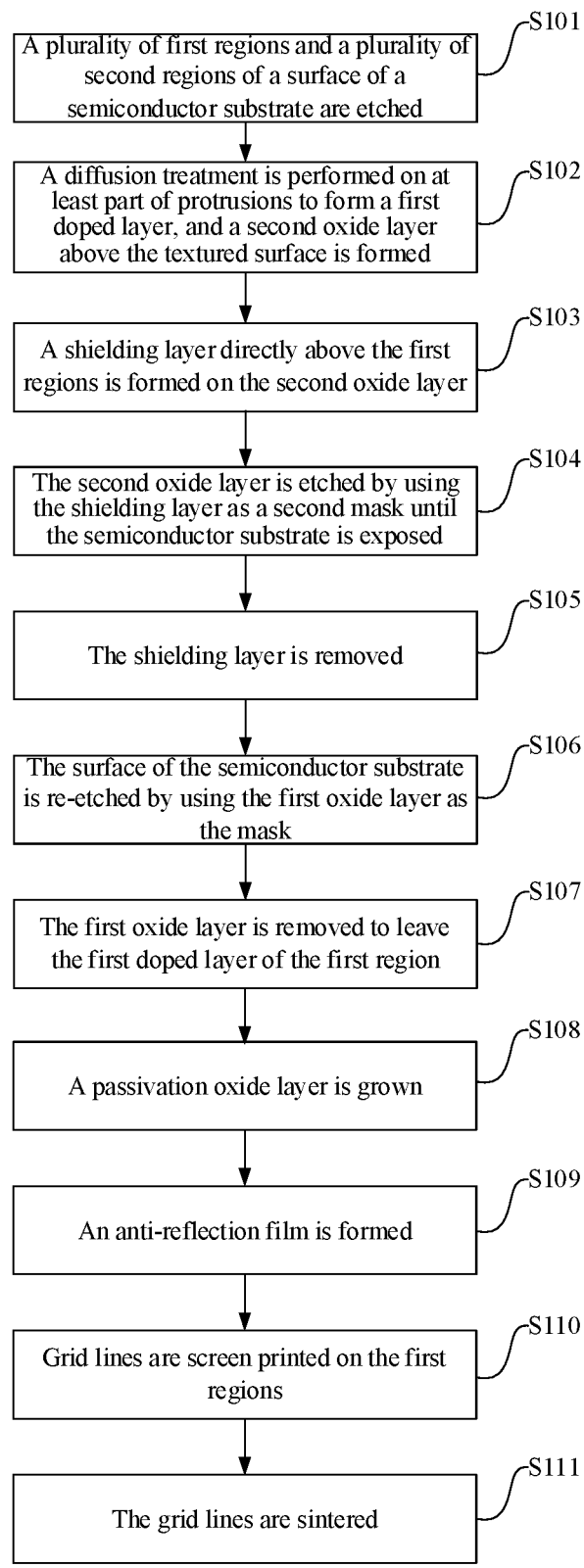
FIG. 1 shows a flowchart of a method for preparing a selective emitter solar cell according to some embodiments of the present disclosure.

As shown in FIG. 1, in an embodiment, a method for preparing the selective emitter solar cell of the present disclosure includes the following steps.

In S101, a plurality of first regions and a plurality of second regions of a surface of a semiconductor substrate are etched.

Figure 2:
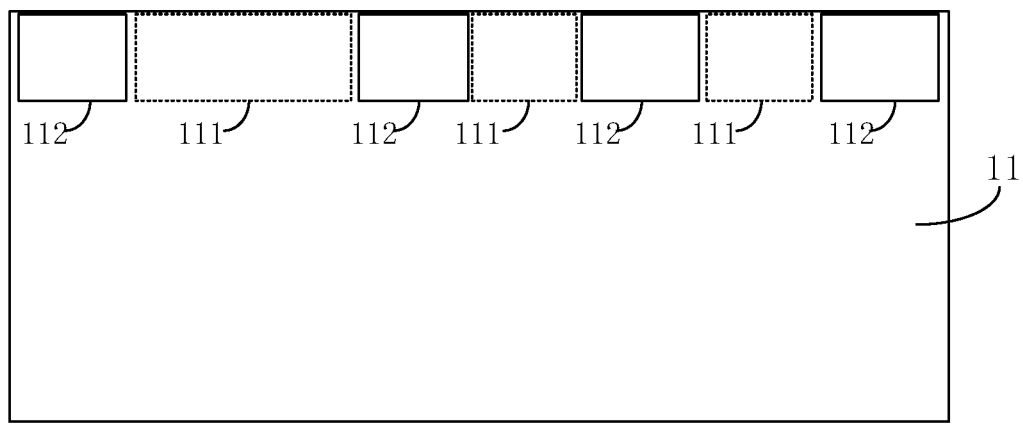
FIGS. 2 to 3 show cross-sectional views illustrating etching first regions and second regions on a surface of a semiconductor substrate according to some embodiments of the present disclosure.
Figure 3:
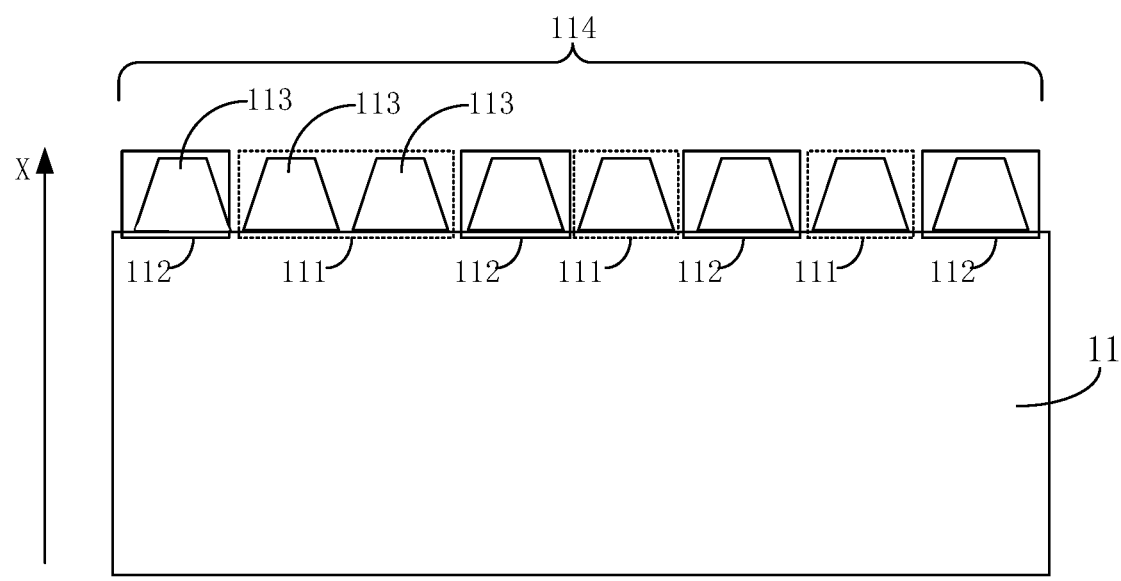

Referring to FIGS. 2-3, the surface of the semiconductor substrate includes a plurality of first regions 111 and a plurality of second regions 112. A first region 111 refers to a highly-doped deeply-expanded region contacting a metal grid line of the selective emitter (SE) solar cell. A second region 112 refers to a lowly-doped shallowly-expanded region not contacting a metal grid line of the SE solar cell. In this step, the semiconductor substrate 11 is placed in a first texturing solution at a temperature of 65° C. to 85° C. to etch the plurality of first regions 111 and the plurality of second regions 112 of the surface of the semiconductor substrate 11.

In an embodiment, the semiconductor substrate 11 is an N-type semiconductor (i.e., an electronic semiconductor), and the semiconductor substrate 11 is placed in the first texturing solution at a temperature of 70° C. to etch the surface of the semiconductor substrate 11. The first texturing solution includes a potassium hydroxide, a texturing additive and a hydrogen peroxide. The potassium hydroxide is used to chemically react with silicon in the plurality of first regions 111 and the plurality of second regions of the surface of the semiconductor substrate 11 for etching. The texturing additive includes an isopropanol (IPA). The texturing additive is used to improve the wettability of the first texturing solution on the surface of the semiconductor substrate 11, and the texturing additive has a buffering effect on the transport process of hydroxide ions in the potassium hydroxide from the potassium hydroxide solution to the surface of semiconductor substrate 11, so that when a large batch of the semiconductor substrates 11 are etched, the content of the potassium hydroxide in the solution has a relatively wide range, which is beneficial for improving the stability of product processing quality. The hydrogen peroxide can reduce a reaction rate of the potassium hydroxide with the surface of the semiconductor substrate 11, so that a textured surface 114 with a plurality of protrusions 113 is formed on the surface of the semiconductor substrate 11 (i.e., the plurality of protrusions 113 are formed on the plurality of first regions 111 and the plurality of second regions of the surface of the semiconductor substrate 11), and a cross-sectional shape of each protrusion 113 in a thickness direction of the semiconductor substrate 11 (i.e., the X direction in the figure) is substantially trapezoidal or trapezoid-like.

In an embodiment, a volume ratio of the texturing additive, the hydrogen peroxide and the potassium hydroxide in the first texturing solution is 2:8:3. By this way, it is ensured that the surface of the semiconductor substrate 11 forms a textured surface 114 with the plurality of protrusions 113 within 7 minutes to 10 minutes, and the cross-sectional shape of each protrusion 113 in the thickness direction of the semiconductor substrate 11 is substantially trapezoidal or trapezoid-like. The surface of the semiconductor substrate 11 includes the plurality of first regions 111 and the plurality of second regions 112, each first region or each second region is provided with at least one protrusion formed thereon.

In an embodiment, the first texturing solution may include a sodium hydroxide, other than the potassium hydroxide. The etching rate of etching the surface of semiconductor substrate may be adjusted by adjusting the volume ratio of each component in the first texturing solution. Therefore, as the volume ratio of each component in the first texturing solution is adjusted, the time for etching the semiconductor substrate in the first texturing solution and the temperature of the first texturing solution may be adjusted accordingly, so as to etch the surface of semiconductor substrate to form the textured surface with the plurality of protrusions. The semiconductor substrate is provided with the surface opposite to a bottom surface of the semiconductor substrate. The protrusions are formed by etching the semiconductor substrate in the thickness direction. Herein, the cross-sectional shape of the protrusion in the thickness direction of the semiconductor substrate is substantially trapezoidal or trapezoid-like. A section profile of the protrusion gradually decreases in a direction away from the bottom surface. During etching, an etching rate varies in different regions of the surface of the semiconductor substrate. As a result, each protrusion formed by etching the semiconductor substrate has a height varying in the thickness direction, i.e., the cross-sectional shape of the protrusion in the thickness direction of the semiconductor substrate is substantially trapezoidal or trapezoid-like. In an example, the cross-sectional shape of the protrusion in the thickness direction of the semiconductor substrate is trapezoid-like, and an upper surface of the protrusion away from the bottom surface of the semiconductor substrate is a curved surface. In another example, the cross-sectional shape of the protrusion in the thickness direction of the semiconductor substrate is substantially trapezoidal, the upper surface of the protrusion away from the bottom surface of the semiconductor substrate is a flat surface, and a height of the protrusion in the thickness direction of the semiconductor substrate gradually increases or decreases partially.

In S102, a diffusion treatment is performed on at least part of a plurality of protrusions to form a first doped layer, and a second oxide layer above the textured surface is formed.

Figure 4:
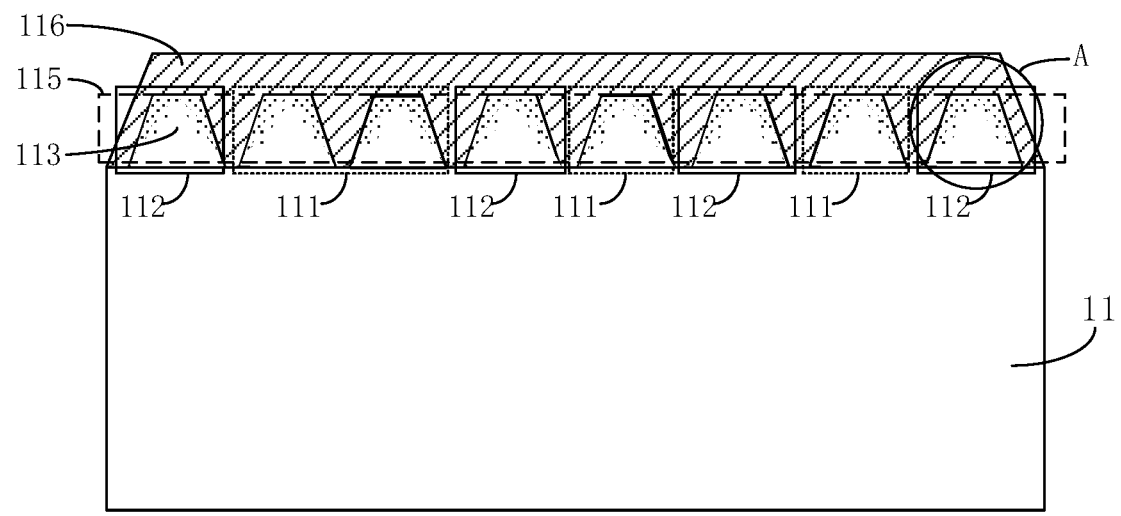
FIG. 4 shows a cross-sectional view illustrating performing a diffusion treatment on at least part of protrusions to form a first doped layer and further forming a second oxide layer above a textured surface according to some embodiments of the present disclosure.
Figure 5:
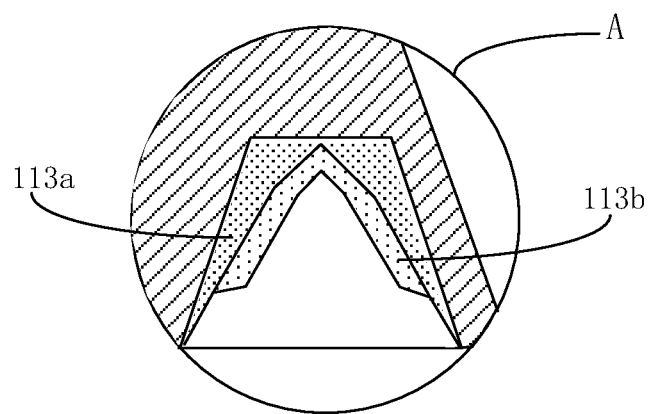
FIG. 5 shows a partial enlarged view of A in the FIG. 4.

Referring to FIGS. 4-5, at least part of the plurality of protrusions 113 is doped with a P-type doping element by using a high-temperature diffusion process or an ion implantation process to form a first doped layer 115. The first doped layer 115 has a sheet resistance greater than 60 Ω/sq and less than 120 Ω/sq. For the first doped layer 115, a doping depth of the doping element is 0.8 um to 1.5 um (um: micron), and a doping concentration of the doping element is $3 \times 10^{20}$ to $5 \times 10^{20}$ doping elements per square centimeter (atoms/cm$^2$). During performing doping on the at least part of protrusion 113, the doped P-type doping elements diffuse from an outer surface of the protrusion 113 to an inner of the protrusion 113. Therefore, the doping concentration of the doping element is higher in a partial region close to the surface of the protrusion 113 (i.e., 113a shown in the FIG. 5) and lower in a partial region inside the protrusion 113 (i.e., 113b shown in the FIG. 5).

In some embodiments, the doping element includes boron, and the at least part of the protrusions 113 is doped with the boron by using the high-temperature diffusion process. In the process of doping the boron, firstly, boron atoms are deposited on the protrusions 113, and then the semiconductor substrate 11 and the deposited boron atoms are heated for thermal excitation of silicon atoms in the semiconductor substrate 11, so that silicon atoms may obtain high enough energy to move out of lattice positions and leave vacancies. At this time, the boron atoms are ionized into boron ions through a discharge chamber, and then the boron ions are implanted into the semiconductor substrate 11 to achieve the doping of the boron elements in the at least part of the protrusions 113 of the semiconductor substrate 11. The first doped layer 115 is used to form PN junction, i.e., the first doped layer 115 is in contact with other portion of the semiconductor substrate 11 (excluding the selective emitter) to form PN junction.

In the above doping process, a thin layer chromatography technology may be adopted. The surface of the semiconductor substrate 11 is covered with the boron element. Some boron atoms covering the surface of the semiconductor substrate 11 react chemically with the semiconductor substrate 11 to generate a borosilicate glass in the thickness direction of the semiconductor substrate. The borosilicate glass may have a thickness of 70 nm (nm: nanometer). The borosilicate glass has chemical properties similar to silicon oxide. Therefore, the borosilicate glass may be used as a second oxide layer 116 above the textured surface. In this way, the diffusion treatment is performed on the at least part of the protrusions 113 to form the first doped layer 115, as well as the second oxide layer 116 above the textured surface.

In an embodiment, the second oxide layer above the textured surface may be formed on the surface of the semiconductor substrate by using a chemical vapor deposition process, after the diffusion treatment is performed on the at least part of the protrusions. The second oxide layer has a thickness of 50 nm to 150 nm in the thickness direction of the semiconductor substrate.

In addition, since the boron element is doped in the at least part of the protrusions 113 by using the high-temperature diffusion process, a damage of the surface of the semiconductor substrate can be prevented, and the requirement of the SE solar cell to form a high doping concentration in the region contacting a grid line can be met. In some embodiments, if the semiconductor substrate in step S101 is a P-type semiconductor, the doping element in step S102 can be a doped N-type doping element.

In S103, a shielding layer only above the first regions is formed on the second oxide layer.

Figure 6:
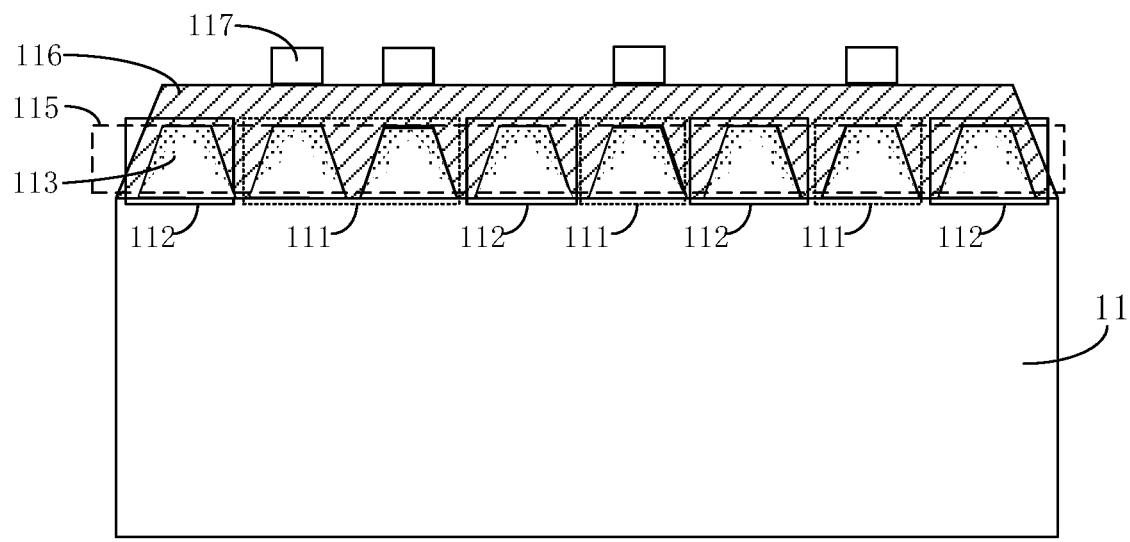
FIG. 6 shows a cross-sectional view illustrating forming a shielding layer only above the first regions on the second oxide layer according to some embodiments of the present disclosure.

As shown in FIG. 6, a shielding layer 117 only above the first regions 111 is formed on the second oxide layer 116 by plating or 3D printing. The shielding layer 117 has a thickness greater than 40 nm in the thickness direction of the semiconductor substrate 11. The shielding layer 117 is soluble in an alkaline solution and insoluble in an acidic solution. In an embodiment, the material of the shielding layer 117 is a paraffin wax.

In S104, the second oxide layer is etched by using the shielding layer as a second mask until the semiconductor substrate is exposed.

Figure 7:
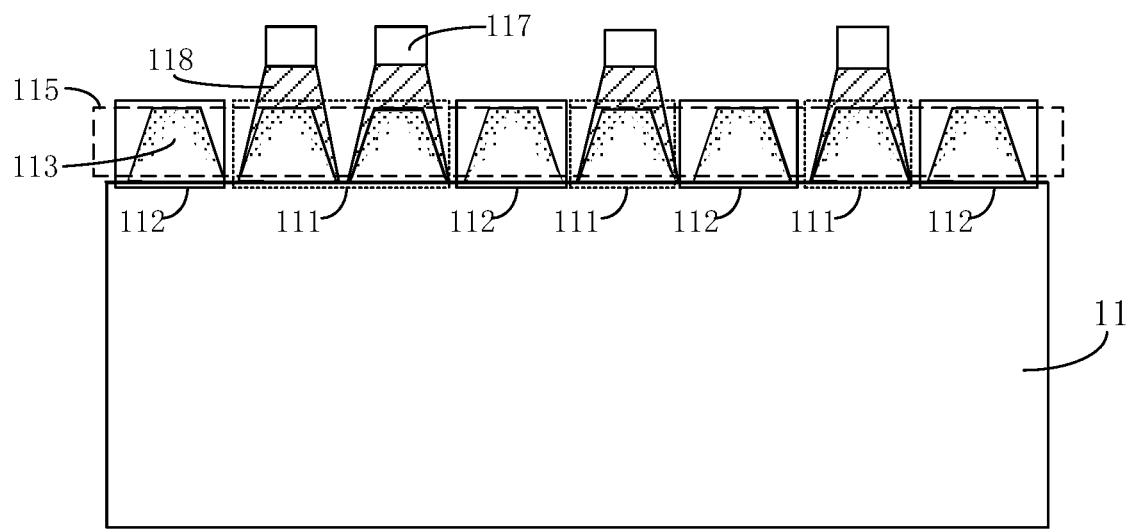
FIG. 7 shows a cross-sectional view illustrating etching the second oxide layer by using the shielding layer as a second mask until the semiconductor substrate is exposed according to some embodiments of the present disclosure.

Referring to FIGS. 6-7, the semiconductor substrate 11 with the shielding layer 117 is subjected to the acidic solution to remove the second oxide layer 116 above the second regions 112, and finally the second oxide layer 116 is etched to form a first oxide layer 118 only above the first regions 111. Herein, the first oxide layer 118 refers to the remained second oxide layer 116 above the first regions 111.

In an embodiment, the main component of the acidic solution is a hydrofluoric acid. Since the shielding layer 117 is insoluble in acid, the shielding layer 117 isolates the acidic solution from contacting the second oxide layer 116 directly under the shielding layer 117, so that the second oxide layer 116 directly under the shielding layer 117 may not be soluble in the hydrofluoric acid solution, and the second oxide layer 116 is etched to form the first oxide layer 118 only above the first regions 111. Since the second oxide layer 116 is easily soluble in the hydrofluoric acid solution, in order to prevent the second oxide layer 116 directly above the first regions 111 from being dissolved in the hydrofluoric acid solution, the semiconductor substrate 11 with the shielding layer 117 is quickly subjected to the hydrofluoric acid solution.

In S105, the shielding layer is removed.

Figure 8:
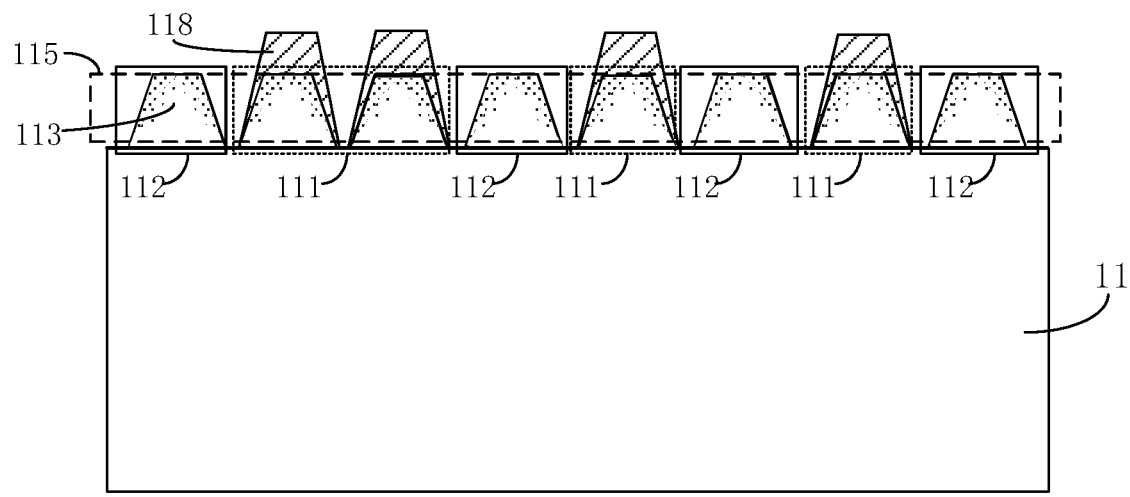
FIG. 8 shows a cross-sectional view illustrating removing the shielding layer according to some embodiments of the present disclosure.

Referring to FIGS. 7-8, the semiconductor substrate 11 with the shielding layer 117 and the first oxide layer 118 is subjected to the alkaline solution to remove the shielding layer 117. In an embodiment, the main component of the alkaline solution is a sodium hydroxide.

In S106, the surface of the semiconductor substrate is re-etched by using the first oxide layer as the mask.

Figure 9:
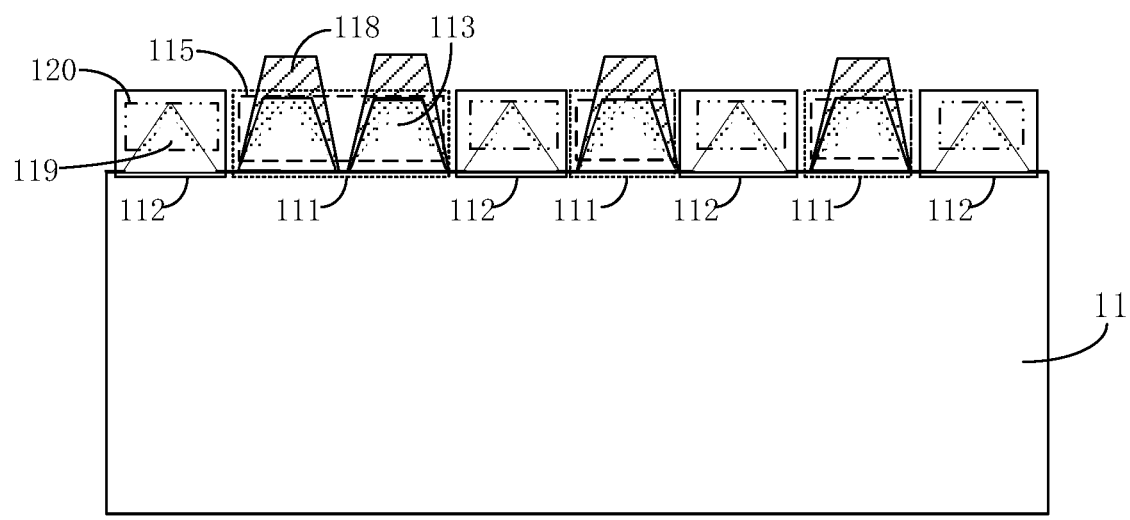
FIG. 9 shows a cross-sectional view illustrating re-etching the surface of the semiconductor substrate by using the first oxide layer as a mask according to some embodiments of the present disclosure.
Figure 10:
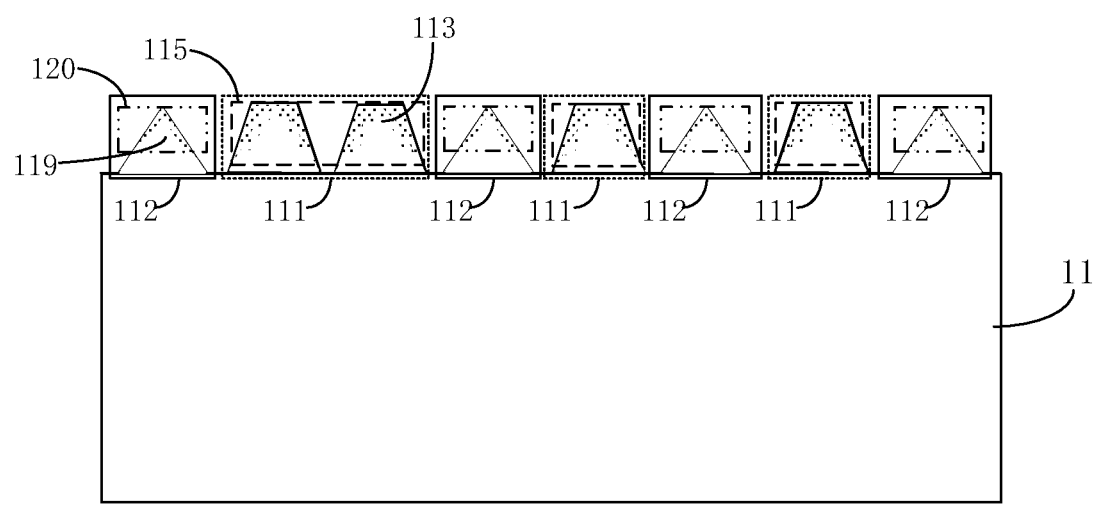
FIG. 10 shows a cross-sectional view illustrating removing the first oxide layer to retain the first doped layer of the first regions according to some embodiments of the present disclosure.

Referring to FIGS. 9-10, in this step, the semiconductor substrate 11 is placed in a second texturing solution at a temperature of 75° C. to 85° C., to etch the second regions 112 of the surface of the semiconductor substrate 11.

In an embodiment, the semiconductor substrate 11 is placed in the second texturing solution at a temperature of 80° C. The second texturing solution includes the texturing additive and the potassium hydroxide. Since the first regions 111 are covered with the first oxide layer 118, when the second texturing solution etches the semiconductor substrate 11, an etching rate of etching the first oxide layer 118 in the first regions 111 may be much lower than an etching rate of etching the protrusions 113 in the second regions 112. Further, in this step, during etching, the first oxide layer 118 is not completely etched off after finishing etching the protrusions 113 in the second regions 112, thus preventing the second texturing solution from etching the protrusions 113 in the first regions.

Further, a volume ratio of the texturing additive and the potassium hydroxide in the second texturing solution is 1:3, and an etching time is 100 s to 300 s (s: second). The etching time may be increased or decreased by changing the volume ratio of the texturing additive and the potassium hydroxide in the second texturing solution. In the etching process, the protrusions in the second regions are chemically reacted with the potassium hydroxide for etching. In the case that the content of the texturing additive is constant, increasing the content of the potassium hydroxide may increase the etching rate and reduce the etching time.

As shown in FIG. 5, the partial region close to the surface of the protrusion 113 (i.e., 113a shown in the figure) has a higher doping concentration of the doping element, while the partial region inside the protrusion 113 (i.e., 113b shown in the figure) has a lower doping concentration of the doping element. Thus, when each protrusion 113 in the second regions 112 is etched to form a pyramid structure 119, the partial region close to the surface of the protrusion 113 is etched off, and the partial region inside the protrusion 113 with the lower doping concentration is left. Therefore, in the case that the protrusion 113 in the second regions 112 is etched to form the pyramid structure 119, a doping concentration of the pyramid structure 119 is decreased (i.e., lower than a doping concentration of the protrusion 113 in the second regions 112 before etching), so that the first doped layer 115 in the second regions 112 is etched to form a second doped layer 120 with a doping concentration lower than a doping concentration of the first doped layer 115 in the first regions 111. The first doped layer 115 in the first regions 111 and the second doped layer 120 in the second regions 112 form the selective emitter.

In an embodiment, for the second doped layer 120, a sheet resistance is greater than 150 Ω/sq, a doping depth of the doping element is less than 0.7 um, and a doping concentration of the doping element is $5 \times 10^{18}$ to $2 \times 10^{19}$ doping elements per square centimeter. Since the pyramid structures 119 are formed by etching the second regions 112 twice, the pyramid structures 119 in the second regions 112 are smaller and the doping element are distributed more evenly, thereby improving the light trapping effect of the pyramid structure 119 and improving a short-circuit current and conversion efficiency of the SE solar cell.

In S107, the first oxide layer is removed to leave the first doped layer of the first region.

In an embodiment, as shown in FIG. 9 and FIG. 10, the semiconductor substrate 11 with the first oxide layer 118 is subjected to the acidic solution to remove the first oxide layer 118, so that the first regions 111 of the surface of the semiconductor substrate 11 includes a plurality of protrusions 113, and the cross-sectional shape of each protrusion 113 in the thickness direction of the semiconductor substrate 11 is substantially trapezoidal or trapezoidal-like. At least part of the protrusions 113 in the first regions is referred as the first doped layer 115 doped with the boron. The second regions 112 include a plurality of pyramid structures 119, and at least part of the pyramid structures 119 is referred as the second doped layer 120 doped with the boron. The doping concentration of the first doped layer 115 is greater than the doping concentration of the second doped layer 120, and the first doped layer 115 and the second doped layer 120 form the selective emitter.

In an embodiment, the main component of the acidic solution is hydrofluoric acid. In order to prevent the semiconductor substrate 11 from chemically reacting with the hydrofluoric acid, the semiconductor substrate 11 is quickly subjected to the hydrofluoric acid solution to remove the first oxide layer 118.

In S108, a passivation oxide layer is grown.

Figure 11:
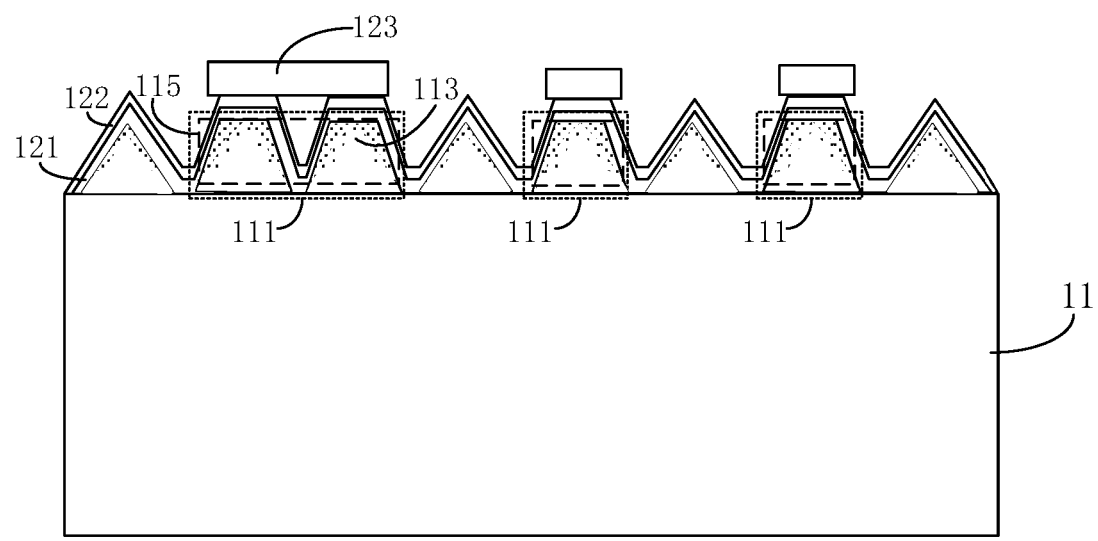
FIG. 11 shows a cross-sectional view illustrating growing a passivation oxide layer, forming an anti-reflection film and screen printing grid lines in the first regions according to some embodiments of the present disclosure.

As shown in FIG. 11, a passivation oxide layer 121 is grown in the first regions 111 and the second regions 112 of the semiconductor substrate 11 by using a plasma enhanced chemical vapor deposition processor the like. This can increase an open circuit voltage of the SE solar cell. In an embodiment, the passivation oxide layer 121 may have a thickness not less than 120 nm. In addition, since the cross-sectional shape of the protrusion 113 in the thickness direction of the semiconductor substrate 11 is substantially trapezoidal or trapezoidal-like, the protrusion 113 can have relatively low recombination loss and is easier to be passivated.

In S109, an anti-reflection film is formed.

In an embodiment, as shown in FIG. 11, the first regions 111 and the second regions 112 of the semiconductor substrate 11 are plated with an antireflection film 122. This can reduce a sunlight reflection of the SE solar cell and increase a current of the SE solar cell. In an embodiment, the antireflection film 122 may have a thickness of 75 nm to 90 nm.

In S110, grid lines are screen printed in the first regions.

In an embodiment, as shown in FIG. 11, a screen printing is performed in the first regions 111 to leave metal paste 123 on the surfaces of the plurality of protrusions 113 of the first regions 111. The metal paste 123 is silver paste or aluminum paste.

In S111, the grid lines are sintered.

Figure 12:
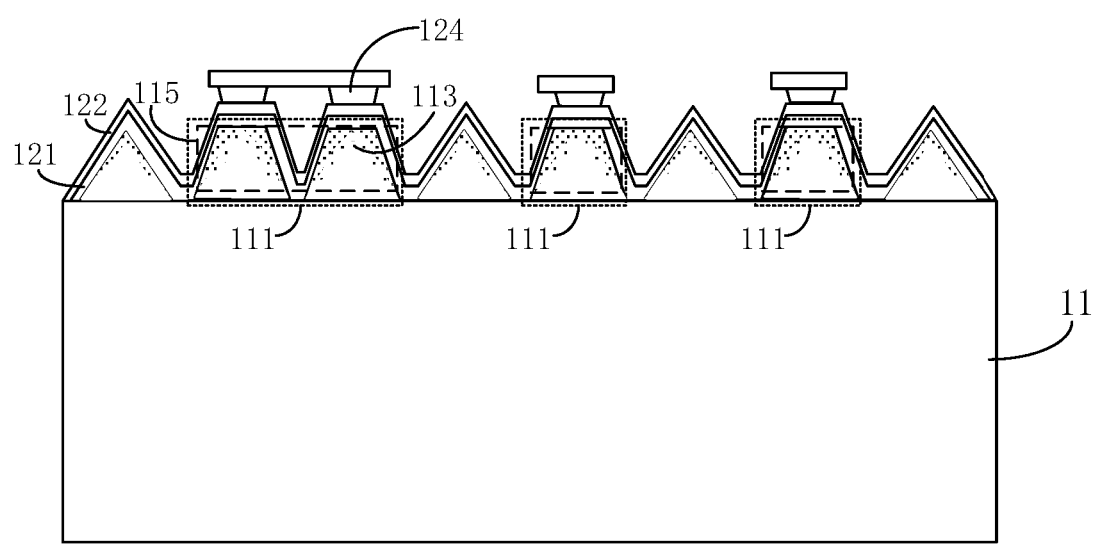
FIG. 12 shows a cross-sectional view after sintering printed grid lines in FIG. 11 according to some embodiments of the present disclosure.

In an embodiment, as shown in FIG. 12, the metal paste 123 in step S110 is dried and solidified, and then sintered. The protrusion 113 has a substantially trapezoidal cross section in the thickness direction of the semiconductor substrate 11, an area of the protrusion 113 contacting with the metal paste is relatively large during sintering, which is beneficial for forming a good metal contact 124 and producing a SE solar cell with lower resistance, thereby improving a fill factor of the SE solar cell and further improving the efficiency of the SE solar cell.

In contrast, in the case that the first regions (i.e., the highly-doped regions) are provided with pyramidal protrusions, the pyramid protrusion is in a relatively poor contact with the metal paste when screen printing the grid line at a tip of the pyramid protrusion, and the metal paste may spread to the semiconductor substrate during the printed grid line is sintered, a damage may be caused to the pyramid protrusion, which increases the recombination loss and reduces the passivation effect of the SE solar cell, resulting in low cell efficiency.

Some embodiments of the present disclosure relate to a selective emitter (SE) solar cell. The selective emitter solar cell is a solar cell obtained by any of the above-mentioned methods for preparing the selective emitter solar cell.

In an embodiment, the SE solar cell includes a semiconductor substrate 11, the selective emitter provided on the semiconductor substrate 11. Thus a PN junction may be formed based on the selective emitter and other portion of the semiconductor substrate 11 excluding the selective emitter. Herein, a surface of the semiconductor substrate 11 includes first regions 111 and second regions 112. The first regions 111 include a plurality of protrusions 113. The protrusion 113 has a cross-sectional shape of substantially trapezoidal or trapezoid-like in a thickness direction of the semiconductor substrate 11. At least part of each protrusion 113 is doped with a P-type doping element or an N-type doping element, and is referred as a first doped layer 115. The second regions 112 include a plurality of pyramid structures 119. At least part of each pyramid structure 119 is doped with the P-type doping element or the N-type doping element, and is referred as a second doped layer 120. A doping concentration of the first doped layer 115 is greater than a doping concentration of the second doped layer 120. The first doped layer 115 and the second doped layer 120 form the selective emitter.

The cross-section shape of the protrusion 113 in the thickness direction of the semiconductor substrate 11 is substantially trapezoidal or trapezoid-like (other than a pyramid structure), so that the protrusion 113 has no defect (tip), thereby avoiding the accumulation of doping elements in the protrusion 113 and reducing the recombination loss of the selective emitter solar cell during application. Further, the second regions 112 includes the plurality of pyramid protrusions 119, and the at least part of pyramid protrusions 119 is doped with the P-type doping element or the N-type doping element, and is referred as the second doped layer 120, thereby increasing the light trapping effect of the second regions 112 and improving a short-circuit current of the selective emitter.

In an embodiment, for the first doped layer 115, a sheet resistance is greater than 60 Ω/sq and less than 120 Ω/sq, a doping depth of the doping element of the first doped layer 115 is 0.8 um to 1.5 um (um: micron), and a doping concentration of the doping element is $3\times10^{20}$ to $5\times10^{20}$ doping elements per square centimeter. For the second doped layer 120, a sheet resistance is greater than 150 Ω/sq, the doping depth of the doping element is less than 0.7 um, and the doping concentration of the doping element is $5\times10^{18}$ to $2\times10^{19}$ doping elements per square centimeter. Since the pyramid structures 119 are formed by etching the second regions 112 twice, each pyramid structure 119 in the second regions 112 is smaller and the doping element therein is distributed more evenly, thereby improving the light trapping effect of the pyramid structures 119 and improving a short-circuit current and conversion efficiency of the SE solar cell.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A method for preparing a selective emitter solar cell, comprising:
   etching first original regions and second original regions of a surface of an original semiconductor substrate, to form a textured surface with a plurality of original protrusions in the first original regions and the second original regions of the surface of the original semiconductor substrate, wherein each of the plurality of original protrusions has a cross-sectional shape that is trapezoidal or trapezoid-like in a thickness direction of the original semiconductor substrate;
   performing a diffusion treatment on at least part of the plurality of original protrusions to form an original first doped layer, and forming a first oxide layer on the first original regions, wherein the original first doped layer comprises a P-type doping element or an N-type doping element;
   re-etching the surface of the original semiconductor substrate by using the first oxide layer as a mask, to etch each of the plurality of original protrusions in the second original regions to form a pyramid structure, such that part of the original first doped layer in the second original regions is etched to form a second doped layer, and such that the original semiconductor substrate is etched to form a semiconductor substrate with first regions and second regions, the first regions comprise a plurality of protrusions, the first regions are formed from the first original regions respectively, the second regions are formed from the second original regions respectively, the plurality of protrusions are formed from the plurality of original protrusions in the first original regions respectively, and a cross-sectional shape of each of the plurality of protrusions in a thickness direction of the semiconductor substrate is trapezoidal or trapezoid-like; and
   removing the first oxide layer, retaining the original first doped layer in the first regions as a first doped layer, at least part of the plurality of the protrusions forms the first doped layer, a doping concentration of the first doped layer is greater than a doping concentration of the second doped layer, the selective emitter solar cell including the first doped layer in the first regions and the second doped layer in the second regions.

2. The method according to claim 1, wherein performing the diffusion treatment on at least part of the plurality of original protrusions to form the original first doped layer, and forming the first oxide layer on the first original regions comprises:
   performing the diffusion treatment on the at least part of the plurality of original protrusions to form the original first doped layer, and forming a second oxide layer above the textured surface;
   forming a shielding layer above the original first regions on the second oxide layer;
   etching the second oxide layer by using the shielding layer as a second mask until the original semiconductor substrate is exposed, such that the second oxide layer is etched in order to form the first oxide layer above the original first regions; and
   removing the shielding layer.

3. The method according to claim 2, wherein the second oxide layer has a thickness of 50 nm to 150 nm in a thickness direction of the original semiconductor substrate.

4. The method according to claim 1, wherein the etching the first original regions and the second original regions of the surface of the original semiconductor substrate comprises:
   placing the original semiconductor substrate in a first texturing solution at a temperature of 65° C. to 85° C., and etching the first original regions and the second original regions of the surface of the original semiconductor substrate, wherein the first texturing solution comprises a texturing additive, a hydrogen peroxide and a potassium hydroxide.

5. The method according to claim 4, wherein a volume ratio of the texturing additive, the hydrogen peroxide and the potassium hydroxide in the first texturing solution is 2:8:3.

6. The method according to claim 1, wherein the re-etching the surface of the original semiconductor substrate using the first oxide layer as the mask comprises:
   placing the original semiconductor substrate in a second texturing solution at a temperature of 75° C. to 85° C., and re-etching the surface of the original semiconductor substrate by using the first oxide layer as the mask, wherein the second texturing solution comprises a texturing additive and a potassium hydroxide.

7. The method according to claim 6, wherein a volume ratio of the texturing additive and the potassium hydroxide in the second texturing solution is 1:3.

8. The method according to claim 1, wherein each of the first original regions refers to a highly-doped deeply-expanded region contacting a metal grid line of the selective emitter solar cell; each of the second original regions refers to a lowly-doped shallowly-expanded region not contacting a metal grid line of the selective emitter solar cell.

9. The method according to claim 1, wherein the performing the diffusion treatment on at least part of the plurality of original protrusions to form the original first doped layer comprises: doping the at least part of the plurality of original protrusions with doping element by using a high-temperature diffusion process or an ion implantation process to form the original first doped layer.

10. The method according to claim 2, wherein, after the removing the shielding layer, the method sequentially comprises:
growing a passivation oxide layer in the first original regions and the second original regions of the original semiconductor substrate,
forming an anti-reflection film on the passivation oxide layer,
screen printing grid lines in the first original regions, and sintering the grid lines.

11. The method according to claim 10, wherein, the screen printing grid lines in the first original regions comprises:
performing screen printing in the first original regions to leave metal paste on the surfaces of the plurality of original protrusions of the first original regions.

12. The method according to claim 2, the performing the diffusion treatment on the at least part of the original plurality of protrusions to form the original first doped layer, and forming the second oxide layer above the textured surface comprises:
covering with boron element on the surface of the original semiconductor substrate by using a thin layer chromatography process, to generate a borosilicate glass in the thickness direction of the original semiconductor substrate;
using the borosilicate glass as the second oxide layer above the textured surface.

13. The method according to claim 2, wherein, the forming the second oxide layer above the textured surface comprises:
forming the second oxide layer above the textured surface by using a chemical vapor deposition process after the performing the diffusion treatment on the at least part of the plurality of original protrusions to form the original first doped layer.

14. The method according to claim 2, wherein, the forming the shielding layer above the first original regions on the second oxide layer comprising: the shielding layer above the first original regions on the second oxide layer is formed by plating or 3D printing, wherein the shielding layer is a paraffin wax;
the etching the second oxide layer by using the shielding layer as a second mask until the original semiconductor substrate is exposed comprises: the original semiconductor substrate with the shielding layer is subjected to the acidic solution to remove the second oxide layer above the second original regions.

15. The method according to claim 1, wherein a sheet resistance of the first doped layer is 60 Ω/sq to 120 Ω/sq.

16. The method according to claim 1, wherein a sheet resistance of the second doped layer is greater than 150 Ω/sq.

17. The method according to claim 1, wherein a doping depth of the doping element of the first doped layer is 0.8 um to 1.5 um, and a doping concentration of the doping element of the first doped layer is $3\times10^{20}$ to $5\times10^{20}$ doping elements per square centimeter.

18. The method according to claim 1, wherein a doping depth of the doping element of the second doped layer is less than 0.7 um, and a doping concentration of the doping element of the second doped layer is $5\times10^{18}$ to $2\times10^{19}$ doping elements per square centimeter.

19. A selective emitter solar cell, comprising:
a semiconductor substrate, and
a selective emitter provided in the semiconductor substrate, the selective emitter including a first doped layer and a second doped layer,
wherein a surface of the semiconductor substrate comprises first regions and second regions,
the first regions comprise a plurality of protrusions, a cross-sectional shape of each of the plurality of protrusions in a thickness direction of the semiconductor substrate is trapezoidal or trapezoid-like, and at least part of the plurality of the protrusions forms the first doped layer doped with a P-type doping element or an N-type doping element,
the second regions comprise a plurality of pyramid structures, and at least part of the plurality of pyramid structures forms the second doped layer doped with the P-type doping element or the N-type doping element;
wherein a doping concentration of the first doped layer is greater than a doping concentration of the second doped layer;
wherein, the selective emitter solar cell is prepared by a method, comprising:
etching first original regions and second original regions of a surface of an original semiconductor substrate, to form a textured surface with a plurality of original protrusions in the first original regions and the second original regions of the surface of the original semiconductor substrate, wherein each of the plurality of original protrusions has a cross-sectional shape that is trapezoidal or trapezoid-like in a thickness direction of the original semiconductor substrate;
performing a diffusion treatment on at least part of the plurality of original protrusions to form an original first doped layer, and forming a first oxide layer on the first original regions, wherein the original first doped layer comprises a P-type doping element or an N-type doping element;
re-etching the surface of the original semiconductor substrate by using the first oxide layer as a mask, to etch each of the plurality of original protrusions in the second original regions to form a pyramid structure, such that part of the original first doped layer in the second original regions is etched to form the second doped layer, and such that the original semiconductor substrate is etched to form the semiconductor substrate with the first regions and the second regions, the first regions comprise the plurality of protrusions, the first regions are formed from the first original regions respectively, the second regions are formed from the second original regions respectively, the plurality of protrusions are formed from the plurality of original protrusions in the first original regions respectively, and a cross-sectional shape of each of the plurality of protrusions in a thickness direction of the semiconductor substrate is trapezoidal or trapezoid-like; and removing the first oxide layer, retaining the original first doped layer in the first regions as the first doped layer, at least part of the plurality of the protrusions forms the first doped layer, a doping concentration of the first doped layer is greater than a doping concentration of the second doped layer, the selective emitter solar cell including the first doped layer in the first regions and the second doped layer in the second regions.

20. The selective emitter solar cell according to claim 19, wherein a sheet resistance of the first doped layer is 60 Ω/sq to 120 Ω/sq, a sheet resistance of the second doped layer is greater than 150 Ω/sq.

* * * * *